(12) United States Patent
Pascal

(10) Patent No.: US 6,497,241 B1
(45) Date of Patent: Dec. 24, 2002

(54) HOLLOW CORE SPINDLE AND SPIN, RINSE, AND DRY MODULE INCLUDING THE SAME

(75) Inventor: Roy Winston Pascal, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/470,690

(22) Filed: Dec. 23, 1999

(51) Int. Cl.[7] .................................................. B08B 3/02
(52) U.S. Cl. ........................ 134/153; 134/138; 134/148; 134/157; 134/902
(58) Field of Search ................................ 134/138, 140, 134/148, 153, 157, 200, 902

(56) References Cited

U.S. PATENT DOCUMENTS

| | | | |
|---|---|---|---|
| 3,953,265 A | * | 4/1976 | Hood |
| 4,021,278 A | * | 5/1977 | Hood et al. |
| 4,339,297 A | * | 7/1982 | Aigo |
| 4,544,446 A | * | 10/1985 | Cady |
| 4,903,717 A | | 2/1990 | Sumnitsch |
| 4,968,375 A | * | 11/1990 | Sato et al. |
| 4,969,676 A | * | 11/1990 | Lamagna |
| 5,421,056 A | | 6/1995 | Tateyama et al. |
| 5,485,644 A | * | 1/1996 | Shinbara et al. |
| 5,513,668 A | | 5/1996 | Sumnitsch |
| 5,591,262 A | * | 1/1997 | Sago et al. |
| 5,718,763 A | * | 2/1998 | Tateyama et al. |
| 5,762,708 A | * | 6/1998 | Motoda et al. |
| 5,927,303 A | * | 7/1999 | Miya et al. |
| 5,964,954 A | | 10/1999 | Matsukawa et al. |
| 6,090,205 A | * | 7/2000 | Saka et al. |
| 6,115,867 A | * | 9/2000 | Nakashima et al. |
| 6,193,798 B1 | * | 2/2001 | Sumnitsch |
| 6,273,104 B1 | | 8/2001 | Shinbara et al. |

FOREIGN PATENT DOCUMENTS

| JP | 62-247531 | * 10/1987 | ................. 134/902 |
|---|---|---|---|
| JP | 64-25539 | * 1/1989 | ................. 134/902 |

* cited by examiner

Primary Examiner—Frankie L. Stinson
(74) Attorney, Agent, or Firm—Martine & Penilla, LLP

(57) ABSTRACT

A spindle includes a hollow central shaft having an upper end and a lower end. The hollow central shaft defines a channel for transmitting fluid through the spindle. A wafer backing plate is disposed at the upper end of the hollow central shaft. The wafer backing plate reduces particle recontamination on the backside of a semiconductor wafer disposed above the spindle by preventing particles from contacting the backside of the wafer during spin processing. A spin, rinse, and dry module includes a bowl and a hollow core spindle for rotating a wafer that extends into the bowl. The hollow core spindle has a channel defined therein for transmitting a fluid to the backside of the wafer and a wafer backing plate disposed at an upper end thereof for preventing particles from contacting the backside of the wafer during spin processing.

18 Claims, 3 Drawing Sheets

6,497,241 B1

HOLLOW CORE SPINDLE AND SPIN, RINSE, AND DRY MODULE INCLUDING THE SAME

BACKGROUND OF THE INVENTION

The present invention relates generally to semiconductor fabrication and, more particularly, to a hollow core spindle and a spin, rinse, and dry module including the hollow core spindle.

As the semiconductor industry moves to larger, e.g., 300 mm, wafers and to smaller, e.g., 0.18 μm and smaller, feature sizes, it is becoming increasingly more important to control wafer contamination on the backside, i.e., the bottom side, of wafers during wafer preparation operations. In one conventional wafer preparation operation, a wafer is spin rinsed in a spin, rinse, and dry (SRD) module. During this spin rinsing operation, deionized (DI) water is sprayed onto the top side and the backside of a wafer as the wafer is spun at high speed. One problem with this spin rinsing operation is that recirculating air from above the wafer often causes particle recontamination on the backside of the wafer.

FIG. 1 is a simplified schematic diagram 10 illustrating the airflow around a wafer in a conventional bowl, which forms part of an SRD module. As shown therein, wafer 12 is disposed in bowl 14. For ease of illustration, the spindle, which spins the wafer, and the spindle fingers, which support the wafer above the spindle, have been omitted from FIG. 1. As wafer 12 spins in bowl 14, the spinning action of the wafer transfers energy to the air flowing to the top side of the wafer. This transferred energy causes the airflow above the top side of wafer 12 to become turbulent and creates recirculating air, i.e., eddies, as indicated by the arrows in FIG. 1. The amount of energy transferred to the air flowing to the top side of wafer 12 depends on the diameter and the rotational speed of the wafer. In general, the greater the amount of energy transferred to the air, the higher the eddies extend above the top side and the farther the eddies extend below the backside of wafer 12. The presence of eddies below wafer 12 is undesirable because particles or DI water droplets removed from the wafer can circulate in the eddies and be redeposited on the backside of the wafer, thereby causing recontamination.

In view of the foregoing, there is a need for a device for controlling the airflow on a backside of a wafer during spin processing to minimize the recontamination caused by particles and DI water droplets circulating in eddies below the wafer.

SUMMARY OF THE INVENTION

Broadly speaking, the present invention fills this need by providing a spindle having a hollow core through which fluids can be delivered to the backside of a semiconductor wafer. In combination with a wafer backing plate, the hollow core spindle enables the airflow on the backside of the wafer to be controlled. The present invention also provides a spin, rinse, and dry module including the hollow core spindle.

In accordance with one aspect of the present invention, a spindle is provided. The spindle includes a hollow central shaft having an upper end and a lower end. The hollow central shaft defines a channel for transmitting fluid therethrough. A wafer backing plate is disposed at the upper end of the hollow central shaft.

In one embodiment, the hollow central shaft is an actuator shaft and a hollow spindle shaft is concentrically disposed around the actuator shaft. In one embodiment, the hollow spindle shaft has a pair of high speed bearings and a housing mounted thereon. In this embodiment, the housing encloses the pair of high speed bearings. In one embodiment, the size of each of the high speed bearings is the same.

In one embodiment, a mounting plate is disposed at an upper end of the hollow spindle shaft, and a spin chuck is mounted on the mounting plate. In one embodiment, the actuator shaft is configured to move vertically to actuate the spin chuck for supporting the wafer as well as to rotate. In one embodiment, the wafer backing plate is mounted on the spin chuck. In one embodiment, the wafer backing plate is mounted on the spin chuck with at least three spring-loaded pistons. In one embodiment, the wafer backing plate has a shape that substantially corresponds with the shape of the wafer.

In accordance with another aspect of the present invention, a spin, rinse, and dry (SRD) module is provided. The SRD module includes a bowl and a hollow core spindle for rotating a semiconductor wafer that extends into the bowl. The hollow core spindle has a channel defined therein for transmitting a fluid to the backside of the wafer and a wafer backing plate disposed at an upper end thereof. In one embodiment, the wafer backing plate is configured to block particles from contacting the backside of the wafer.

In one embodiment, the SRD module includes an internal air supply tube disposed within the channel and an air source in flow communication with the internal air supply tube. In one embodiment, the air source is an ultra low penetrating air (ULPA) filter unit. In one embodiment, the distance the wafer backing plate is disposed below the wafer is in a range from about 80 thousandths of an inch to about 275 thousandths of an inch.

The hollow core spindle of the present invention allows fluids, e.g., air and chemistries, to be delivered through the spindle directly to the backside of a semiconductor wafer disposed above the spindle for spin processing. This is beneficial in and of itself because it avoids the atomization problems that occur when chemistries are sprayed onto the backside of the wafer through rotating spindle components. In combination with the wafer backing plate of the present invention, the hollow core spindle is further beneficial because it enables the airflow on the backside of the wafer to be controlled so that contaminated air does not recirculate into the volume defined by the wafer and the wafer backing plate. Moreover, the wafer backing plate of the present invention advantageously reduces particle recontamination by preventing particles from contacting the backside of the wafer.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Figure 1:
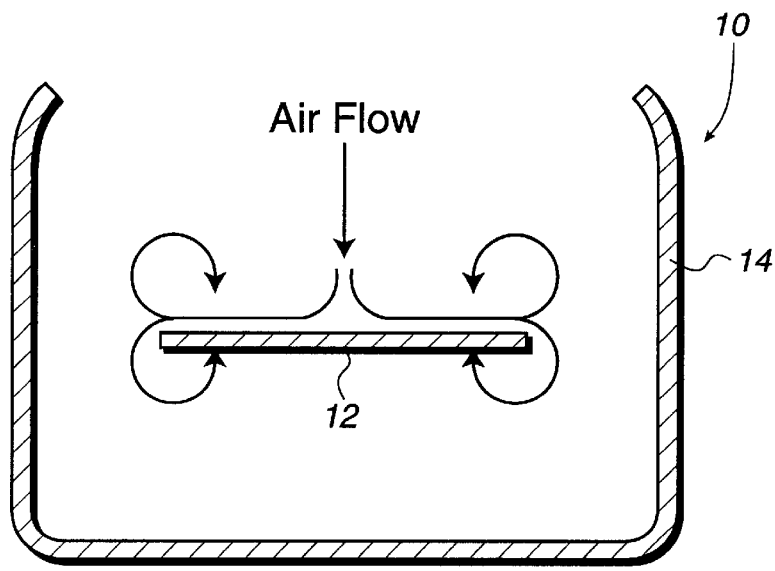
FIG. 1 is a simplified schematic diagram illustrating the airflow around a wafer in a conventional bowl.

Several exemplary embodiments of the invention will now be described in detail with reference to the accompanying drawings. FIG. 1 is discussed above in the "Background of the Invention" section.

Figure 2:
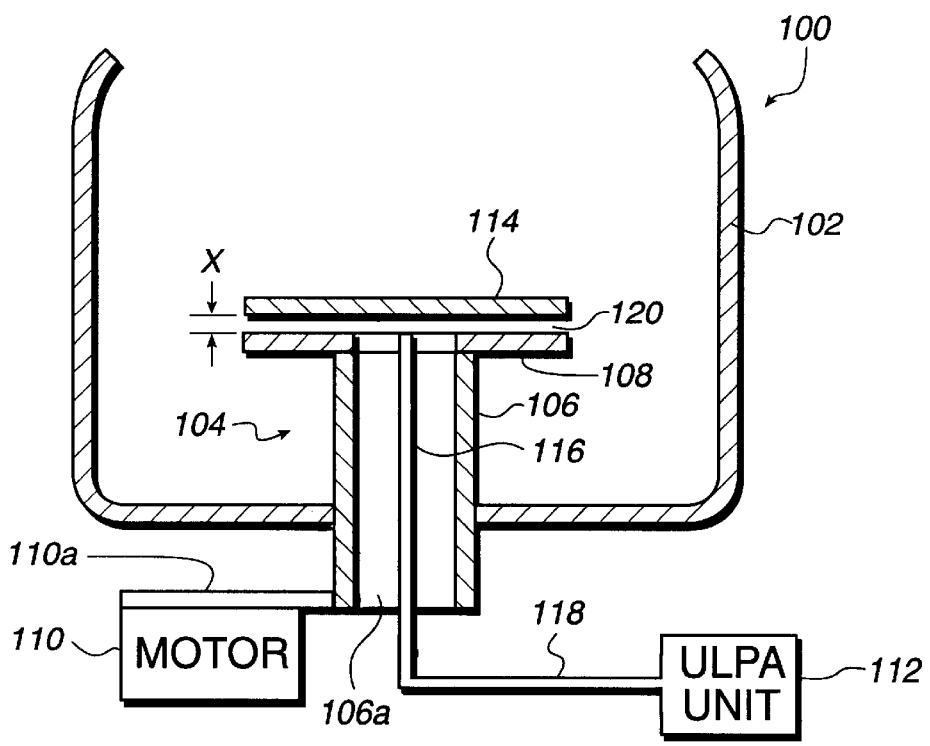
FIG. 2 is a simplified schematic diagram of a spin, rinse, and dry (SRD) module in accordance with one embodiment of the invention.

FIG. 2 is a simplified schematic diagram of spin, rinse, and dry (SRD) module 100 in accordance with one embodiment of the invention. As shown therein, SRD module 100 includes bowl 102, hollow core spindle 104, wafer backing plate 108, motor 110, drive mechanism 110a, and ultra low penetrating air (ULPA) filter unit 112. Hollow core spindle 104 includes hollow central shaft 106. Semiconductor wafer 114 may be supported above hollow core spindle 104 and wafer backing plate 108 by any suitable support mechanism, e.g., spindle fingers that extend upwardly from a spindle arm coupled to the hollow core spindle. The spindle fingers and spindle arm, which are well known to those skilled in the art, have been omitted from FIG. 2 for ease of illustration.

Wafer backing plate 108, which has a central aperture formed therein, is mounted at the upper end of hollow central shaft 106 with appropriate mechanical fasteners, e.g., screws. Channel 106a extends through the central portion of hollow central shaft 106. Internal air supply tube 116 is disposed within channel 106a. Internal air supply tube 116 may be secured within channel 106a with a bearing (not shown) at the upper end of hollow central shaft 106 and a bracket (not shown) at the lower end of this shaft. Drive mechanism 110a, which is driven by motor 110, is coupled to the lower end of hollow core spindle 104 for rotating the spindle. In one embodiment, drive mechanism 110a is a belt, e.g., a timing belt. Air supply tube 118 couples ultra low penetrating air (ULPA) filter unit 112 in flow communication with internal air supply tube 116.

Wafer backing plate 108 and wafer 114 define volume 120 therebetween. During spin processing, hollow core spindle 104, wafer backing plate 108, and wafer 114 rotate at substantially the same speed because they are coupled together. As hollow core spindle 104, wafer backing plate 108, and wafer 114 rotate, clean air from ULPA unit 112 flows up through internal air supply tube 116. In one embodiment, internal air supply tube 116 is disposed within channel 106a so that air is supplied to volume 120 proximate to the center portion of the backside of wafer 114. The clean air entering volume 120 from internal air supply tube 116 flows outwardly from the center portion of the backside of wafer 114 and exits volume 120 at the outer edges of wafer 114 and wafer backing plate 108. Additional details concerning the airflow on the backside of wafer 114 are described in U.S. patent application Ser. No. 09/471,590, filed on even date herewith, and entitled "Method for Controlling Airflow on a Backside of a Semiconductor Wafer during Spin Processing." The disclosure of this application, which is assigned to Lam Research Corporation, the assignee of the subject application, is incorporated herein by reference.

The distance, X, that wafer backing plate 108 is disposed below wafer 114 and the airflow into volume 120 from internal air supply tube 116 may be controlled so that contaminated air does not recirculate into volume 120. In general, the distance, X, is a function of the pressure of the air supplied to volume 120, the velocity of the airflow down onto the top side of wafer 114, and the spindle speed. By way of example, the ΔP of the air supplied to volume 120 may be varied from 0 to 10 inches of water, as a function of the velocity of the airflow down onto the top side of wafer 114. In one embodiment, the distance, X, that wafer backing plate 108 is disposed below wafer 114 is in a range from about 80 thousandths of an inch to about 275 thousandths of an inch.

In addition to serving as one of the boundaries that define volume 120, wafer backing plate 108 also functions to block particles from contacting the backside of wafer 114. For example, wafer backing plate 108 blocks particles recirculating in eddies that extend below wafer 114. In one embodiment, the shape of wafer backing plate 108 substantially corresponds to that of wafer 114 so that the entire backside of the wafer is shielded from recirculating particles. It will be apparent to those skilled in the art, however, that the shape of wafer backing plate 108 may be varied slightly from that of wafer 114 while still providing effective shielding. By way of example, wafer backing plate 108 need not include the flat edges typically ground into a wafer to indicate crystal orientation and dopant type.

Figure 3:
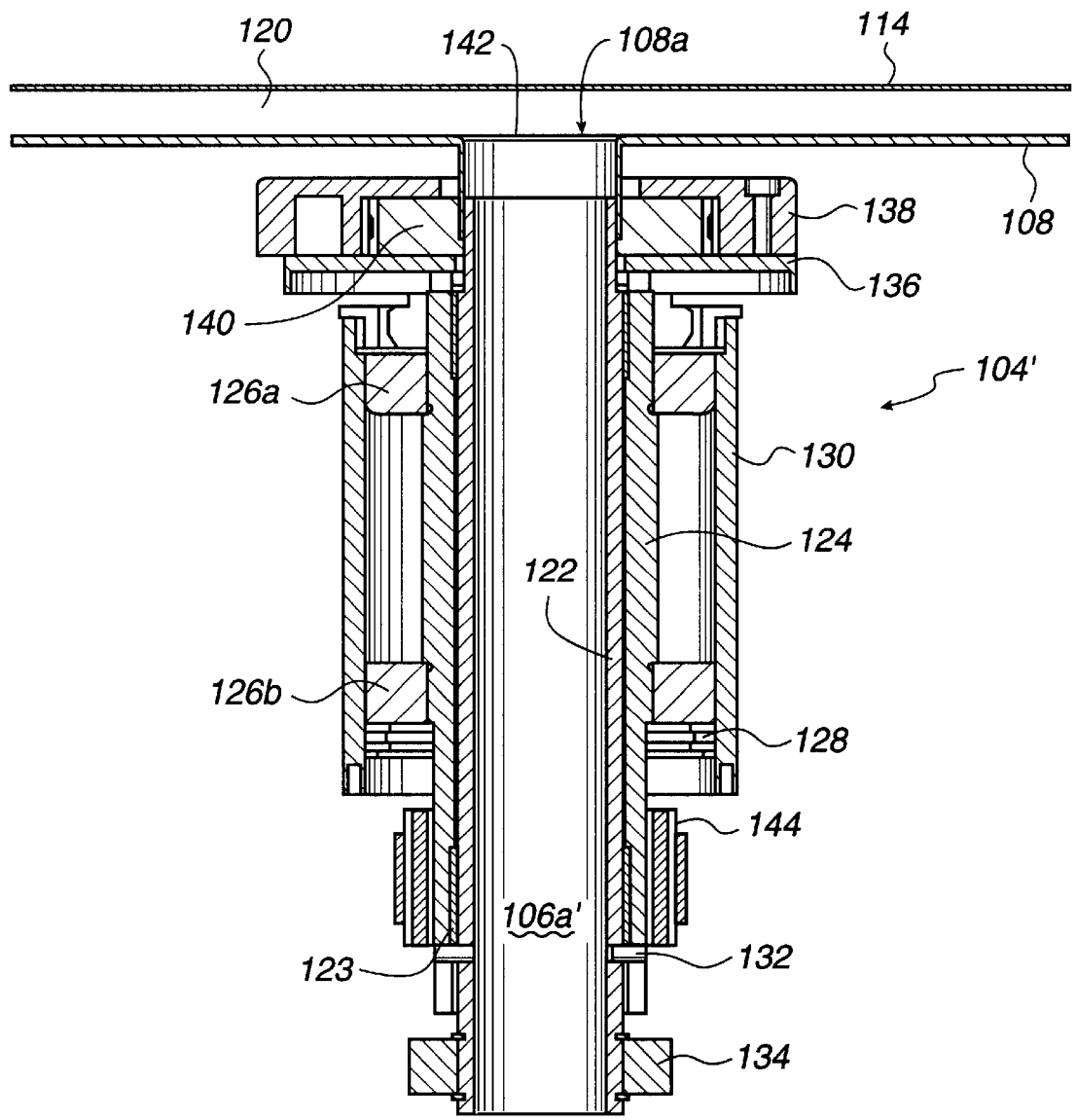
FIG. 3 is a simplified cross-sectional view of a hollow core spindle in accordance with one embodiment of the invention.

FIG. 3 is a simplified cross-sectional view of hollow core spindle 104' in accordance with one embodiment of the invention. As shown therein, hollow core spindle 104' includes hollow actuator shaft 122 and hollow spindle shaft 124, which is concentrically disposed around hollow actuator shaft 122. Hollow actuator shaft 122 is mounted within hollow spindle shaft 124 with bushing 123. In one embodiment, bushing 123 is a high tolerance polymer bushing. The inner surface of hollow actuator shaft 122 defines channel 106a', which extends through hollow core spindle 104'. In one embodiment, the diameter of channel 106a' is about 1.5 inches. High speed bearings 126a and 126b are mounted on hollow spindle shaft 124. In one embodiment, high speed bearings 126a and 126b are large diameter, deep groove bearings of the same size that are configured to rotate at the bearing speed limit, e.g., about 5,000 rpm. High speed bearings 126a and 126b are preloaded by heavy bearing preload 128 to a relatively high level, e.g., about 200 pounds, for increased bearing life at ultra-high speeds and accelerations. Housing 130 is mounted on hollow spindle shaft 124 and encloses high speed bearings 126a and 126b and heavy bearing preload 128.

Dowel pins 132, which are slotted in hollow spindle shaft 124, prevent hollow actuator shaft 122 from rotating separately from hollow spindle shaft 124. Dowel pins 132 allow hollow actuator shaft 122 to move vertically, i.e., up and down, as will be explained in more detail later. Actuator shaft bearing 134, which is constrained by an appropriate assembly, is provided at the lower end of hollow actuator shaft 122. Actuator shaft bearing 134 enables hollow actuator shaft 122 to be moved vertically while the shaft is rotating.

Mounting plate 136 is provided at the upper end of hollow spindle shaft 124. Spin chuck 138 for supporting wafer 114 is mounted on mounting plate 136. Spin chuck 138 includes spin chuck fingers (not shown in FIG. 3) that extend upwardly therefrom and grasp wafer 114, as is well known to those skilled in the art. Turcite nut 140, which translates linear motion into rotary motion, is disposed within spin chuck 138. When a hollow air cylinder (not shown) moves hollow actuator shaft 122 up or down, hollow actuator shaft 122 actuates Turcite nut 140, which in turn actuates spin chuck 138 to grasp wafer 114. More particularly, when hollow actuator shaft 122 is moved up and down, Turcite nut 140 translates this linear motion into rotary motion and actuates spin chuck 138 so that the spin chuck fingers either grasp or release wafer 114.

With continuing reference to FIG. 3, wafer backing plate 108 is disposed at the upper end of hollow actuator shaft 122. Wafer backing plate 108 may be supported for rotation in any suitable manner. In one embodiment, wafer backing plate 108 is mounted on spin chuck 138, as explained in more detail below with reference to FIG. 4. Slinger sleeve 142, which has a labyrinth seal formed therein, is disposed at the upper end of hollow actuator shaft 122. Slinger sleeve 142 centers wafer backing plate 108 on hollow core spindle 104' for balanced rotation. In addition, the labyrinth seal formed within slinger sleeve 142 prevents any liquid that may flow through central aperture 108a of wafer backing plate 108 into channel 106a' from entering the mechanism portion of spin chuck 138.

Hollow core spindle 104' is rotated by timing pulley 144, which may be coupled to a timing belt (not shown in FIG. 3) or other suitable drive mechanism. The components of hollow core spindle 104' that rotate include hollow spindle shaft 124, hollow actuator shaft 122, mounting plate 136, spin chuck 138, and slinger sleeve 142. In addition, wafer backing plate 108 and wafer 114, both of which are mounted on hollow core spindle 104', rotate at substantially the same speed as the hollow core spindle. During rotation, the airflow on the backside of wafer 114 may be controlled by delivering air to volume 120 through channel 106a'. If desired, the air may be supplied to volume 120 via an internal air supply tube disposed with channel 106a', as described above with reference to FIG. 2.

In addition to air, other fluids, e.g., chemistries for rinsing wafer 114, also may be delivered to the center of the backside of wafer 114 through channel 106a'. If desired, nozzles may be provided at the upper end of channel 106a' to deliver the chemistries to the backside of wafer 114. It will be apparent to those skilled in the art that multiple chemistries may be delivered to the backside of wafer 114 through channel 106a' during the same processing cycle. The delivery of chemistries to the backside of wafer 114 through channel 106a' avoids the atomization problems that occur when chemistries are sprayed onto the backside of the wafer through rotating spindle components.

Figure 4:
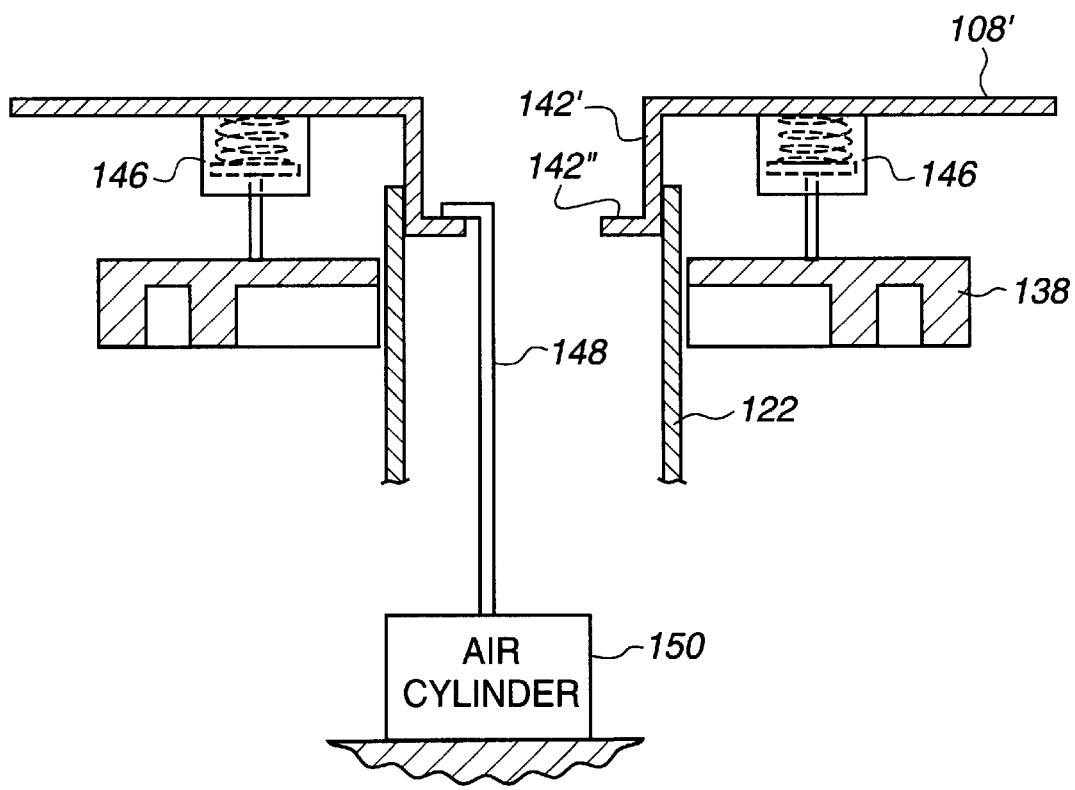
FIG. 4 is a simplified schematic diagram that illustrates the manner in which a wafer backing plate is mounted on a spin chuck in accordance with one embodiment of the invention.

FIG. 4 is a simplified schematic diagram that illustrates the manner in which the wafer backing plate is mounted on the spin chuck in accordance with one embodiment of the invention. As shown therein, spring-loaded piston assemblies 146 support wafer backing plate 108' above spin chuck 138 and generate the force of rotation. The upper and lower ends of spring-loaded piston assemblies 146 are joined to wafer backing plate 108' and spin chuck 138, respectively. In one embodiment, three spring-loaded piston assemblies 146 spaced at approximately 120 degree intervals support wafer backing plate 108'. It will be apparent to those skilled in the art that the number of spring-loaded piston assemblies 146 may be varied to suit the needs of particular applications.

As shown in FIG. 4, wafer backing plate 108' is integrally formed with slinger sleeve portion 142', which extends into the upper end of hollow actuator shaft 122. Slinger sleeve portion 142' has lip 142" at the lower end thereof. Actuator rod 148 is coupled to air cylinder 150, which is disposed below the hollow core spindle and does not rotate. When air cylinder 150 is actuated, actuator rod 148 engages lip 142" and pulls wafer backing plate 108' from the naturally "up" position shown in FIG. 4 to a "down" position that allows an end effector to remove the wafer from the spin chuck. The travel of actuator rod 148 exceeds lip 142" when wafer backing plate 108' is in the "up" position so there is no contact between the rod and the lip during rotation of the hollow core spindle.

Wafer backing plate 108 may be formed of any suitable inert, nonmetallic material. Exemplary materials include polyphenylene sulfide (PPS), polyetheretherketone (PEEK), and polyethylene terephthalate (PET). In one embodiment, wafer backing plate 108 is formed of TECHTRON PPS, which is commercially available from DSM Engineering Plastic Products of Reading, Pa. By way of example, the components of hollow core spindle 104, e.g., hollow actuator shaft 122, hollow spindle shaft 124, and housing 130, may be formed of stainless steel, e.g., 303 stainless steel, or Hastelloy.

The hollow core spindle of the present invention allows fluids, e.g., air and chemistries, to be delivered through the spindle directly to the backside of a semiconductor wafer disposed above the spindle for spin processing. This is beneficial in and of itself because it avoids the atomization problems that occur when chemistries are sprayed onto the backside of the wafer through rotating spindle components. In combination with the wafer backing plate of the present invention, the hollow core spindle is further beneficial because it enables the airflow on the backside of the wafer to be controlled so that contaminated air does not recirculate into the volume defined by the wafer and the wafer backing plate. Moreover, the wafer backing plate of the present invention advantageously reduces particle recontamination by preventing particles from contacting the backside of the wafer.

In summary, the present invention provides a hollow core spindle and an SRD module including the hollow core spindle. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A spindle, comprising:
   a hollow actuator shaft having an upper end and a lower end, the hollow actuator shaft defining a channel for transmitting fluid therethrough;
   a hollow spindle shaft concentrically disposed around the hollow actuator shaft, the hollow spindle shaft having an upper end and a lower end;
   a mounting plate disposed at the upper end of the hollow spindle shaft;
   a spin chuck mounted on the mounting plate; and
   a wafer backing plate disposed at the upper end of the hollow spindle shaft.

2. The spindle of claim 1, wherein the actuator shaft is configured to move vertically to actuate the spin chuck as well as to rotate.

3. The spindle of claim 1, wherein the hollow spindle shaft has a pair of high speed bearings and a housing mounted thereon, the housing enclosing the pair of high speed bearings.

4. The spindle of claim 3, wherein a size of each of the high speed bearings is the same.

5. The spindle of claim 1, wherein the wafer backing plate is mounted on the spin chuck.

6. The spindle of claim 1, wherein the wafer backing plate is mounted on the spin chuck with at least three spring-loaded pistons.

7. The spindle of claim 1, wherein the wafer backing plate has a shape that substantially corresponds with a shape of a semiconductor wafer.

8. A spin, rinse, and dry module, comprising:
   a bowl; and
   a hollow core spindle for rotating a semiconductor wafer extending into the bowl, the hollow core spindle comprising:
      a hollow actuator shaft having an upper end and a lower end, the hollow actuator shaft defining a channel for transmitting a fluid to a backside of the semiconductor wafer;
      a hollow spindle shaft concentrically disposed around the hollow actuator shaft, the hollow spindle shaft having an upper end and a lower end;
      a mounting plate disposed at the upper end of the hollow spindle shaft;
      a spin chuck mounted on the mounting plate; and
      a wafer backing plate disposed at the upper end of the hollow spindle shaft.

9. The spin, rinse, and dry module of claim 8, wherein the wafer backing plate is configured to block particles from contacting the backside of the semiconductor wafer.

10. The spin, rinse, and dry module of claim 8, further comprising: an internal air supply tube disposed within the channel; and an air source in flow communication with the internal air supply tube.

11. The spin, rinse, and dry module of claim 10, wherein the air source is an ULPA filter unit.

12. The spin, rinse, and dry module of claim 8, wherein a distance the wafer backing plate is disposed below the semiconductor wafer is in a range from about 80 thousandths of an inch to about 275 thousandths of an inch.

13. The spin, rinse, and dry module of claim 12, wherein the wafer backing plate has a shape that substantially corresponds with a shape of the semiconductor wafer.

14. A spindle, comprising:
   a hollow actuator shaft, the hollow actuator shaft defining a channel for transmitting fluid therethrough;
   a hollow spindle shaft concentrically disposed around the actuator shaft;
   a pair of high speed bearings mounted on the hollow spindle shaft;
   a housing mounted on the hollow spindle shaft, the housing enclosing the high speed bearings;
   a mounting plate disposed at an upper end of the hollow spindle shaft;
   a spin chuck for supporting a semiconductor wafer mounted on the mounting plate, the spin chuck being actuated by the actuator shaft; and
   a wafer backing plate mounted on the spin chuck.

15. The spindle of claim 14, wherein a size of each of the high speed bearings is the same.

16. The spindle of claim 14, wherein the wafer backing plate is mounted on the spin chuck with at least three spring-loaded pistons.

17. The spindle of claim 14, wherein the wafer backing plate has a shape that substantially corresponds with a shape of the semiconductor wafer.

18. The spindle of claim 14, wherein the hollow actuator shaft is configured to move vertically to actuate the spin chuck as well as to rotate.

* * * * *